(12) United States Patent
Lao et al.

(10) Patent No.: US 9,343,572 B1
(45) Date of Patent: May 17, 2016

(54) HIGH-VOLTAGE SEMICONDUCTOR DEVICE AND METHOD FOR MANUFACTURING THE SAME

(71) Applicant: Vanguard International Semiconductor Corporation, Hsinchu (TW)

(72) Inventors: Chung-Ren Lao, Taichung (TW); Hsing-Chao Liu, Jhudong Township (TW); Chu-Feng Chen, New Taipei (TW); Wei-Chun Chou, New Taipei (TW)

(73) Assignee: Vangaurd International Semiconductor Corporation, Hsinchu (TW)

( * ) Notice: Subject to any disclaimer, the term of this patent is extended or adjusted under 35 U.S.C. 154(b) by 0 days.

(21) Appl. No.: 14/603,997

(22) Filed: Jan. 23, 2015

(51) Int. Cl.
*H01L 29/78* (2006.01)
*H01L 29/40* (2006.01)
*H01L 29/08* (2006.01)
*H01L 29/10* (2006.01)
*H01L 29/66* (2006.01)

(52) U.S. Cl.
CPC ........ *H01L 29/7835* (2013.01); *H01L 29/0865* (2013.01); *H01L 29/0882* (2013.01); *H01L 29/1095* (2013.01); *H01L 29/408* (2013.01); *H01L 29/66659* (2013.01); *H01L 29/66681* (2013.01); *H01L 29/7816* (2013.01)

(58) Field of Classification Search
CPC ............... H01L 29/66659; H01L 29/7835; H01L 21/26586; H01L 29/1045; H01L 29/0847; H01L 29/42368; H01L 29/0696
See application file for complete search history.

(56) References Cited

U.S. PATENT DOCUMENTS

2012/0267715 A1* 10/2012 Chou .................. H01L 29/1045
 257/336
2014/0159153 A1* 6/2014 Qian .................... H01L 29/4983
 257/343

* cited by examiner

*Primary Examiner* — Walter H Swanson
(74) *Attorney, Agent, or Firm* — Birch, Stewart, Kolasch & Birch, LLP

(57) ABSTRACT

A high-voltage semiconductor device is provided. The high-voltage semiconductor device includes a substrate; an epitaxial layer and a gate structure; a first conductive type first high-voltage well region and a second conductive type high-voltage well region disposed in the epitaxial layer at opposite sides of the gate structure respectively, wherein the first conductive type is different from the second conductive type; a source region and a drain region; and a stack structure disposed between the gate structure and the drain region, wherein the stack structure includes: a blocking layer; an insulating layer disposed over the blocking layer; and a conductive layer disposed over the insulating layer and electrically connected the source region or the gate structure. A method for manufacturing the high-voltage semiconductor device is also provided.

20 Claims, 13 Drawing Sheets

HIGH-VOLTAGE SEMICONDUCTOR DEVICE AND METHOD FOR MANUFACTURING THE SAME

BACKGROUND

1. Technical Field

The disclosure relates to a semiconductor device and a method for manufacturing the same, and in particular to a high-voltage semiconductor device and a method for manufacturing the same.

2. Description of the Related Art

High-voltage semiconductor devices are applied to integrated circuits with high voltage and high power. Traditional high-voltage semiconductor devices, for example a vertically diffused metal oxide semiconductor (VDMOS) or a laterally diffused metal oxide semiconductor (LDMOS), are mainly used for devices with at least 18 volts or higher. The advantages of high-voltage device technology include cost effectiveness and process compatibility. High-voltage device technology has been widely used in display driver IC devices, power supply devices, the power-management field, the communications field, the autotronics field, the industrial control field, etc.

High-voltage semiconductor devices utilize the gate voltage to generate a channel and to control the current between source and drain. To prevent punch-through between source and drain in traditional high-voltage semiconductor devices, the channel length of the transistor must be increased. However, as channel length increases, device size increases, such that the chip area increases and the on-resistance ($R_{on}$) of the transistor increases. In addition, since the mobility of the hole is lower than the electron, the on-resistance of the P-type high-voltage semiconductor devices is higher than the N-type high-voltage semiconductor devices, which is unfavorable for improving the P-type high-voltage semiconductor devices.

Therefore, a high-voltage semiconductor device structure which may solve the above problem is needed.

SUMMARY

The present disclosure provides a high-voltage semiconductor device, including: a substrate; an epitaxial layer disposed over the substrate and having a first conductive type; a gate structure disposed over the epitaxial layer; a first conductive type first high-voltage well region and a second conductive type high-voltage well region disposed in the epitaxial layer at opposite sides of the gate structure respectively, wherein the first conductive type is different from the second conductive type; a source region and a drain region disposed in the epitaxial layer at opposite sides of the gate structure respectively; and a stack structure disposed between the gate structure and the drain region, wherein the stack structure includes: a blocking layer; an insulating layer disposed over the blocking layer; and a conductive layer disposed over the insulating layer and electrically connected the source region or the gate structure.

The present disclosure also provides a method for manufacturing a high-voltage semiconductor device, including: providing a substrate; forming an epitaxial layer over the substrate, wherein the epitaxial layer has a first conductive type; forming a first conductive type first high-voltage well region and a second conductive type high-voltage well region disposed in the epitaxial layer, wherein the first conductive type is different from the second conductive type; forming a gate structure over the epitaxial layer, wherein the first conductive type first high-voltage well region and the second conductive type high-voltage well region are disposed at opposite sides of the gate structure respectively; forming a source region and a drain region, wherein the source region and the drain region are disposed in the epitaxial layer at opposite sides of the gate structure respectively; and forming a stack structure between the gate structure and the drain region, wherein the stack structure includes: a blocking layer; an insulating layer disposed over the blocking layer; and a conductive layer disposed over the insulating layer and electrically connected the source region or the gate structure.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
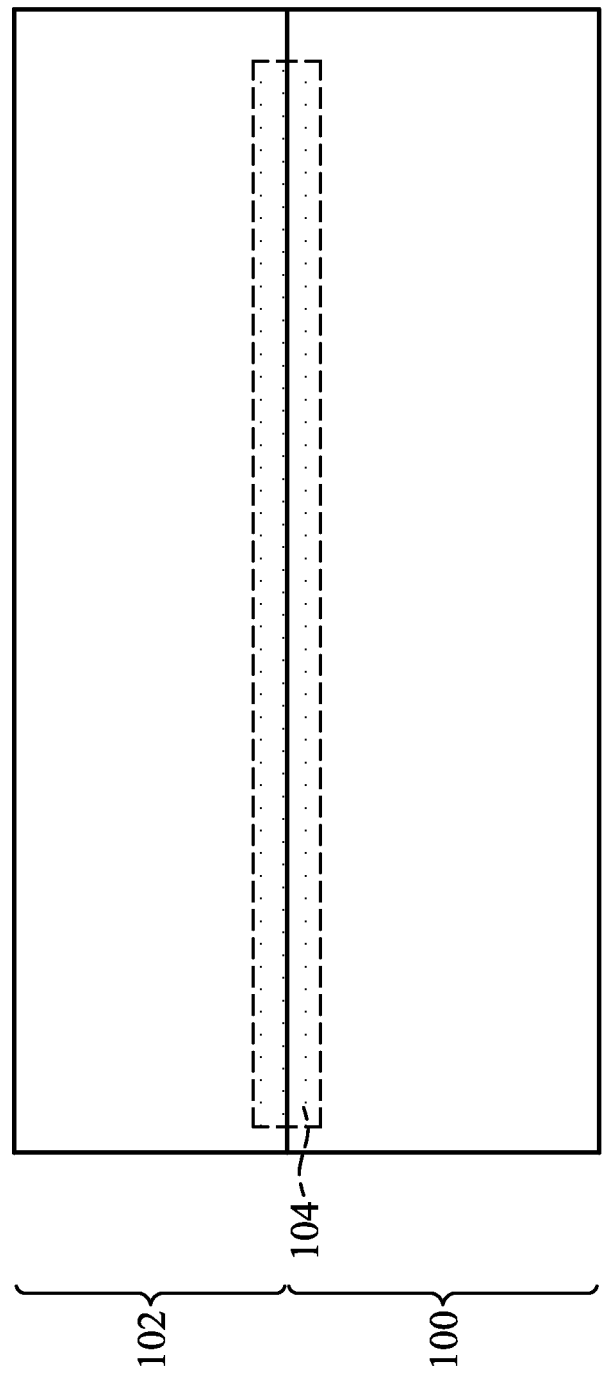
FIGS. 1-8 are cross-sectional views of high-voltage semiconductor device at various manufacturing stages in accordance with some embodiments of the present disclosure.

The high-voltage semiconductor device of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first insulating bump disposed on/over a second material layer", may indicate the direct contact of the first insulating bump and the second material layer, or it may indicate a non-contact state with one or more intermediate layers between the first insulating bump and the second material layer. In the above situation, the first insulating bump may not directly contact the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer directly contacts the other layer, or that the layer does not directly contact the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element at a "lower" side will become an element at a "higher" side.

The terms "about" and "substantially" typically mean +/−20% of the stated value, more typically +/−10% of the stated value and even more typically +/−5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills and the background or the context of the present disclosure, and should not be interpreted in an idealized or overly formal manner unless defined otherwise.

The present disclosure utilizes a stack structure to decrease the electric field density in the channel, which in turn decreases the on-resistance ($R_{on}$) of the high-voltage semiconductor device.

Referring to FIG. 1A, a substrate 100 is provided first. The substrate 100 may include, but is not limited to, semiconductor substrate such as a silicon substrate. In addition, the substrate 100 may include an element semiconductor which may include germanium; a compound semiconductor which may include silicon carbide, gallium arsenide, gallium phosphide, indium phosphide, indium arsenide and/or indium antimonide; an alloy semiconductor which may include SiGe alloy, GaAsP alloy, AlInAs alloy, AlGaAs alloy, GaInAs alloy, GaInP alloy and/or GaInAsP alloy; or a combination thereof. In addition, the substrate 100 may include a semiconductor-on-insulator. In one embodiment, the substrate 100 may be an un-doped substrate. However, in other embodiments, the substrate 100 may be a lightly doped substrate such as a lightly doped P-type substrate or a lightly doped N-type substrate.

Next, an epitaxial layer 102 is formed over the substrate 100. The epitaxial layer 102 may include, but is not limited to, Si, Ge, Si/Ge, III-V compound, or a combination thereof. The epitaxial layer 102 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable methods.

The epitaxial layer 102 has a first conductive type. For example, when the first conductive type is P-type, the epitaxial layer 102 is a P-type epitaxial layer. The P-type epitaxial layer may be formed by adding borane ($BH_3$) or boron tribromide ($BBr_3$) into the reaction gas to perform in-situ doping when depositing the epitaxial layer 102. Alternatively, the un-doped epitaxial layer 102 may be deposited first, then the un-doped epitaxial layer 102 is ion-implanted by boron ion or indium ion.

Next, before the subsequent gate structure is formed, a doping barrier region 104 may optionally be formed in the epitaxial layer 102. The doping barrier region 104 is used to isolate the subsequent active region formed over it from other active regions. The doping barrier region 104 has a second conductive type, and the first conductive type is different from the second conductive type. The doping barrier region 104 may be formed by ion implantation. For example, when the second conductive type is N-type, the predetermined region for the doping barrier region 104 may be implanted with phosphorous ions or arsenic ions to form the doping barrier region 104.

Figure 2:
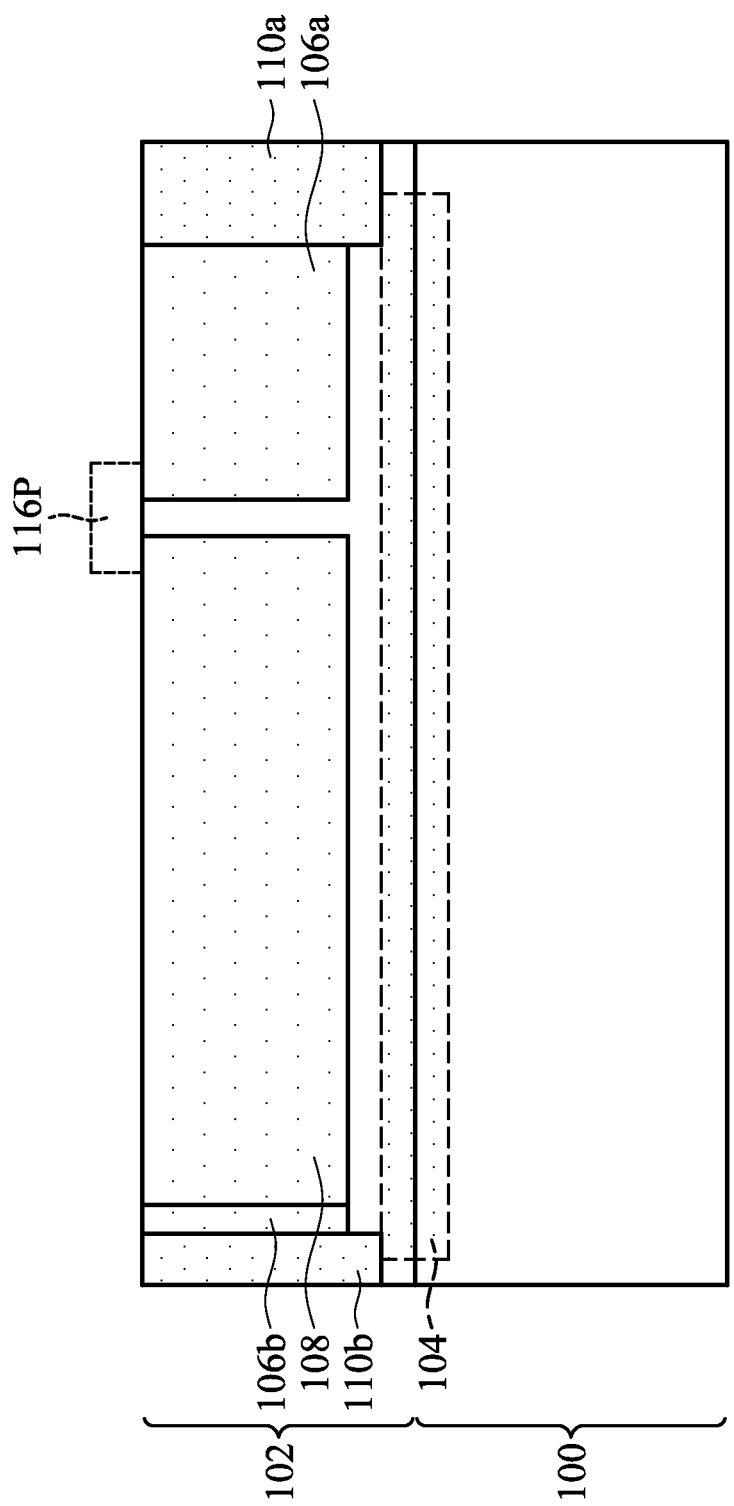

Next, referring to FIG. 2, a first conductive type first high-voltage well region 106a and a second conductive type high-voltage well region 108 are formed in the epitaxial layer 102. The first conductive type first high-voltage well region 106a and the second conductive type high-voltage well region 108 may decrease the gate-to-drain capacitance of the subsequent high-voltage semiconductor device and thus improve this high-voltage semiconductor device.

In particular, the first conductive type first high-voltage well region 106a and the second conductive type high-voltage well region 108 are disposed at opposite sides of the predetermined gate structure region 116P (namely the subsequent gate structure) respectively. The first conductive type first high-voltage well region 106a and the second conductive type high-voltage well region 108 may partially extend under the predetermined gate structure region 116P (namely the subsequent gate structure). The first conductive type first high-voltage well region 106a and the second conductive type high-voltage well region 108 may be formed by ion implantation. For example, when the first conductive type is P-type and the second conductive type is N-type, the predetermined region for the first conductive type first high-voltage well region 106a may be implanted with boron ions or indium ions to form the first conductive type first high-voltage well region 106a, whereas the predetermined region for the second conductive type high-voltage well region 108 may be implanted with phosphorous ions or arsenic ions to form the second conductive type high-voltage well region 108.

In addition, in the embodiment shown in FIG. 2, the first conductive type first high-voltage well region 106a does not directly contact the second conductive type high-voltage well region 108. However, in other embodiments, the first conductive type first high-voltage well region 106a may directly contact the second conductive type high-voltage well region 108. This will be described in detail in the following description. In addition, both of the first conductive type first high-voltage well region 106a and the second conductive type high-voltage well region 108 do not directly contact the doping barrier region 104.

Still referring to FIG. 2, before the subsequent gate structure is formed, a first conductive type second high-voltage well region 106b may optionally be formed in the epitaxial layer 102. The first conductive type second high-voltage well region 106b directly contacts the second conductive type high-voltage well region 108. In other words, the first conductive type first high-voltage well region 106a and the first conductive type second high-voltage well region 106b are disposed at opposite sides of the second conductive type high-voltage well region 108, respectively. The first conductive type second high-voltage well region 106b directly contacts one side of the second conductive type high-voltage well region 108, whereas the first conductive type first high-voltage well region 106a does not directly contact another side of the second conductive type high-voltage well region 108. In addition, the first conductive type second high-voltage well region 106b does not directly contact the doping barrier region 104. The first conductive type second high-voltage well region 106b may be may be formed by the previously described ion implantation. In addition, all of the first conductive type first high-voltage well region 106a, the first conductive type second high-voltage well region 106b and the second conductive type high-voltage well region 108 have similar doping concentration.

In addition, before the subsequent gate structure is formed, a second conductive type first deep well region 110a and a second conductive type second deep well region 110b may optionally be formed in the epitaxial layer 102. Both of the second conductive type first deep well region 110a and the second conductive type second deep well region 110b directly contact the doping barrier region 104. Therefore, the second conductive type first deep well region 110a and the second conductive type second deep well region 110b may further isolate the active region inside them from other active regions.

In addition, the second conductive type first deep well region 110a directly contacts the first conductive type first high-voltage well region 106a, and the second conductive type second deep well region 110b directly contacts the first conductive type second high-voltage well region 106b. In particular, the second conductive type first deep well region 110a and the second conductive type high-voltage well region 108 are disposed at opposite sides of the first conductive type first high-voltage well region 106a, respectively. The second conductive type first deep well region 110a directly contacts one side of the first conductive type first high-voltage well region 106a, whereas the second conductive type high-voltage well region 108 does not directly contact another side of the first conductive type first high-voltage well region 106a. In addition, the second conductive type second deep well region 110b and the second conductive type high-voltage well region 108 are disposed at opposite sides of the first conductive type second high-voltage well region 106b, respectively. The second conductive type second deep well region 110b directly contacts one side of the first conductive type second high-voltage well region 106b, and the second conductive type high-voltage well region 108 also directly contacts another side of the first conductive type second high-voltage well region 106b.

In addition, the second conductive type first deep well region 110a and the second conductive type second deep well region 110b may be formed by the previously described ion implantation. In addition, the second conductive type first deep well region 110a and the second conductive type second deep well region 110b have similar doping concentration. The doping concentration of the second conductive type first deep well region 110a and the second conductive type second deep well region 110b is greater than that of the first conductive type first high-voltage well region 106a, the first conductive type second high-voltage well region 106b and the second conductive type high-voltage well region 108.

Figure 3:
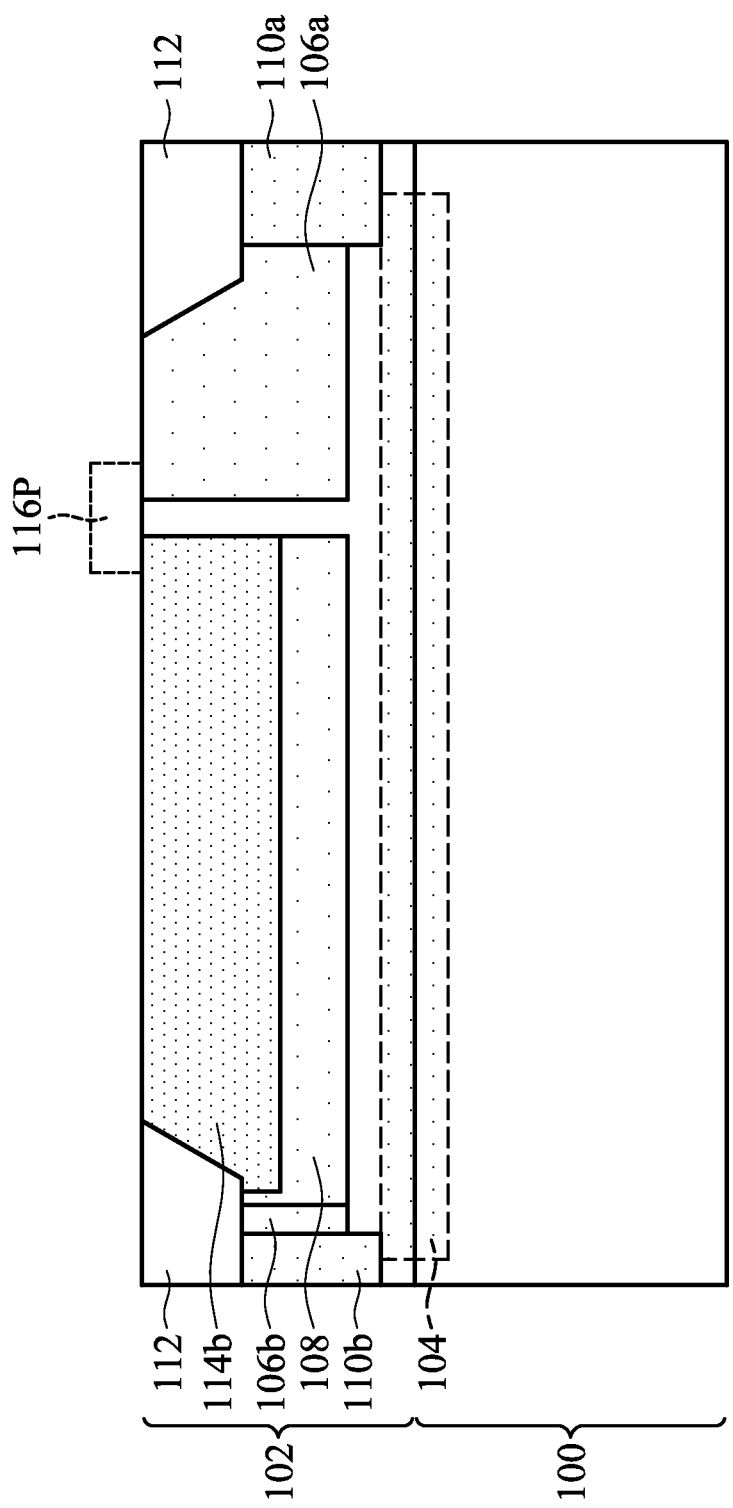

Then referring to FIG. 3, a trench isolation structure 112 may be formed in the epitaxial layer 102 by a shallow trench isolation step to isolate an active region in the substrate 100. However, the active region may be isolated by any other suitable method. For example, the active region in substrate 100 may be isolated by a field oxide layer formed by a local-oxidation of silicon (LOCOS).

After the trench isolation structure 112 is formed and before the subsequent gate structure is formed, a second conductive type doping region 114b may optionally be formed in the second conductive type high-voltage well region 108. The doping concentration of the second conductive type doping region 114b is greater than that of the first conductive type first high-voltage well region 106a, the first conductive type second high-voltage well region 106b, the second conductive type high-voltage well region 108, the second conductive type first deep well region 110a and the second conductive type second deep well region 110b. The second conductive type doping region 114b may further decrease the gate-to-drain capacitance of the subsequent high-voltage semiconductor device and thus improve this high-voltage semiconductor device. The second conductive type doping region 114b may be formed by the previously described ion implantation.

It should be noted that, although the second conductive type doping region 114b is formed before the subsequent gate structure in the embodiment shown in FIG. 3, those skilled in the art will appreciate that the second conductive type doping region 114b may also be formed in the steps used to form the subsequent gate structure. This will be described in detail in the following description. Therefore, the exemplary embodiment set forth in FIG. 3 is merely for the purpose of illustration, the inventive concept may be embodied in various forms without being limited to the exemplary embodiment as shown in FIG. 3.

Figure 4:
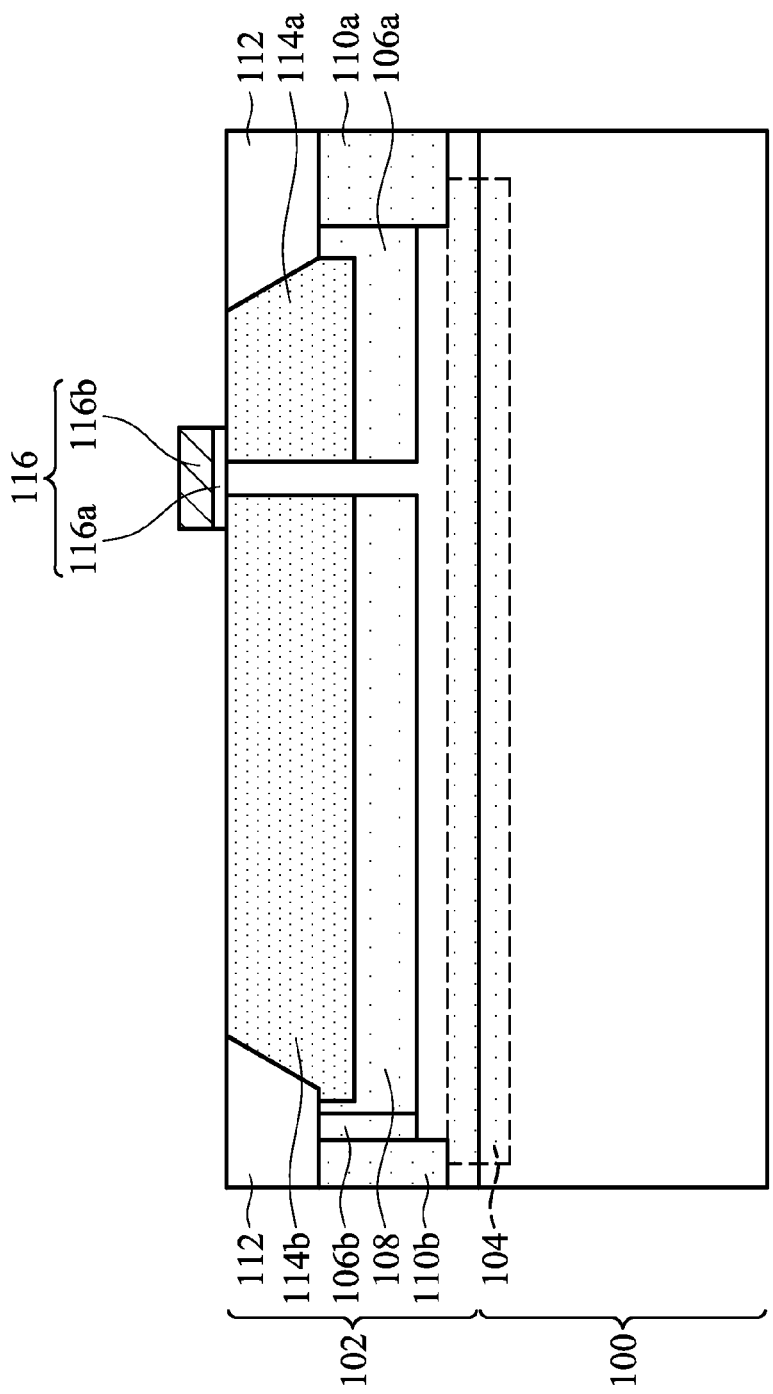

Next, referring to FIG. 4, a gate structure 116 is formed at the predetermined gate structure region 116P over the epitaxial layer 102, and a first conductive type doping region 114a is formed in the first conductive type first high-voltage well region 106a. The gate structure 116 includes a gate dielectric layer 116a and a gate electrode 116b disposed over the gate dielectric layer 116a. In addition, the first conductive type doping region 114a is formed before the subsequent source region. The doping concentration of the first conductive type doping region 114a is greater than that of the first conductive type first high-voltage well region 106a, the first conductive type second high-voltage well region 106b, the second conductive type high-voltage well region 108, the second conductive type first deep well region 110a and the second conductive type second deep well region 110b. The first conductive type doping region 114a may further decrease the gate-to-drain capacitance of the subsequent high-voltage semiconductor device and thus improve this high-voltage semiconductor device.

In one embodiment, a dielectric material layer (not shown, for forming the gate dielectric layer 116a) and a conductive material layer (not shown, for forming the gate electrode 116b) thereon may be blanketly deposited over substrate 100 sequentially. Then the predetermined region of the first conductive type first high-voltage well region 106a (or the epitaxial layer 102) for forming the first conductive type doping region 114a is exposed from the dielectric material layer and the conductive material layer through photolithography and etching steps. Next, the first conductive type doping region 114a is formed by performing ion implantation. Subsequently, the gate dielectric layer 116a and the gate electrode 116b are respectively formed from the dielectric material layer and the conductive material layer by patterning the above two layers through another photolithography and etching step.

In addition, if the second conductive type doping region 114b is not formed before this gate structure, the second conductive type doping region 114b may optionally be formed in the second conductive type high-voltage well region 108 in the aforementioned steps used to form the gate structure 116. In particular, after the first conductive type doping region 114a is formed, the predetermined region of the second conductive type high-voltage well region 108 (or the epitaxial layer 102) for forming the second conductive type doping region 114b is exposed from the dielectric material layer and the conductive material layer through another photolithography and etching step. Next, the second conductive type doping region 114b is formed by performing ion implantation.

The material of the dielectric material layer (i.e. the material of the gate dielectric layer 116a) may include, but is not limited to, silicon oxide, silicon nitride, silicon oxynitride, high-k material, any other suitable dielectric material, or a combination thereof. The high-k material may include, but is not limited to, metal oxide, metal nitride, metal silicide, transition metal oxide, transition metal nitride, transition metal silicide, transition metal oxynitride, metal aluminate, zirconium silicate, and zirconium aluminate. For example, the material of the high-k material may include, but is not limited to, LaO, AlO, ZrO, TiO, $Ta_2O_5$, $Y_2O_3$, $SrTiO_3$ (STO), $BaTiO_3$ (BTO), BaZrO, $HfO_2$, $HfO_3$, HfZrO, HfLaO, HfSiO, HfSiON, LaSiO, AlSiO, HfTaO, HfTiO, HfTaTiO, HfAlON, $(Ba,Sr)TiO_3$ (BST), $Al_2O_3$, any other suitable high-k dielectric material, or a combination thereof. The dielectric material layer may be formed by the previously described chemical vapor deposition or spin-on coating as described previously.

The material of the conductive material layer (i.e. the material of the gate electrode 116b) may include, but is not limited to, amorphous silicon, poly-silicon, one or more metal, metal nitride, conductive metal oxide, or a combination thereof. The metal may include, but is not limited to, molybdenum, tungsten, titanium, tantalum, platinum, or hafnium. The metal nitride may include, but is not limited to, molybdenum nitride, tungsten nitride, titanium nitride or tantalum nitride. The conductive metal oxide may include, but is not limited to, ruthenium oxide or indium tin oxide. The conductive material layer may be formed by the previously described chemical vapor deposition (CVD), sputtering, resistive thermal evaporation, electron beam evaporation, or any other suitable methods. For example, in one embodiment, the amorphous silicon conductive material layer or poly-silicon conductive material layer may be deposited and formed by low-pressure chemical vapor deposition at about 525° C.~650° C. The thickness of the amorphous silicon conductive material layer or poly-silicon conductive material layer may range from about 1000 Å to 10000 Å.

Figure 5:
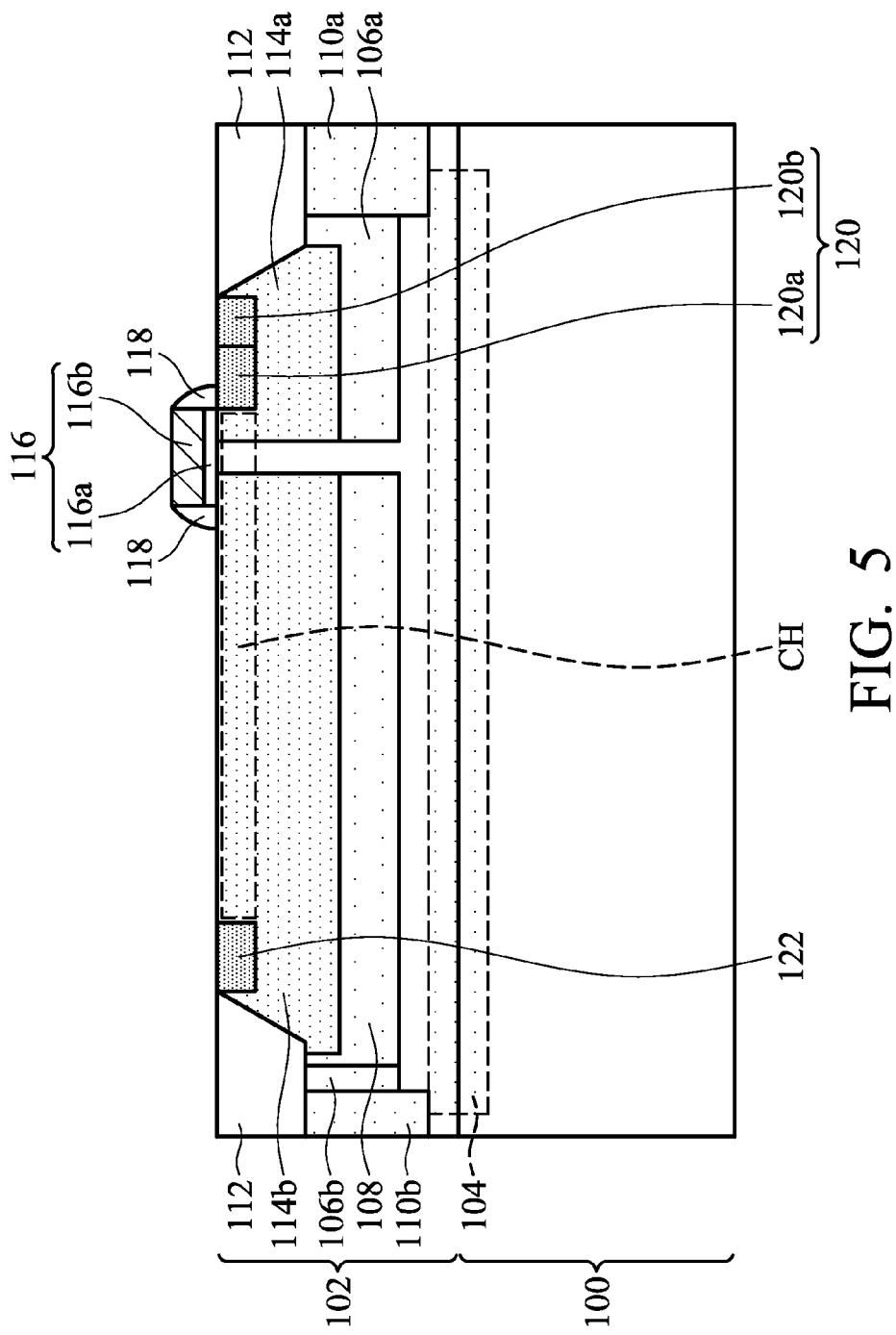

Then referring to FIG. 5, an insulating sidewall layer 118 is formed over the sidewalls of the gate structure 116. In some embodiments, an insulating layer, for example silicon oxide or silicon nitride, with a thickness ranging from about 200 Å to 2000 Å may be deposited by low-pressure chemical vapor deposition or plasma-enhanced chemical vapor deposition at about 350° C.~850° C. Alternatively, when the insulating sidewall layer 118 is a composite sidewall layer, more than one insulating layer may be deposited. After the deposition, $SF_6$, $CF_4$, $CHF_3$ or $C_2F_6$ are used as an etchant and anisotropic etching is performed by a reactive ion etching step to form the insulating sidewall layer 118 over the sidewalls of the gate structure 116.

Still referring to FIG. 5, after the insulating sidewall layer 118, a source region 120 and a drain region 122 are formed. The source region 120 and the drain region 122 are disposed in the epitaxial layer 102 at opposite sides of the gate structure 116 respectively. Specifically, the source region 120 is disposed in the first conductive type doping region 114a (or in the first conductive type first high-voltage well region 106a), and the drain region 122 is disposed in the second conductive type doping region 114b (or in the second conductive type high-voltage well region 108). The source region 120 and the drain region 122 may be formed by ion implantation. In addition, the source region 120 may include a second conductive type source region 120a and a first conductive type source region 120b. The doping concentration of the source region 120 and the drain region 122 is greater than that of the first conductive type first high-voltage well region 106a, the first conductive type second high-voltage well region 106b, the second conductive type high-voltage well region 108, the second conductive type first deep well region 110a, the second conductive type second deep well region 110b, the first conductive type doping region 114a and the second conductive type doping region 114b. In addition, the epitaxial layer 102 between the source region 120 and the drain region 122 has a channel CH.

Figure 6:
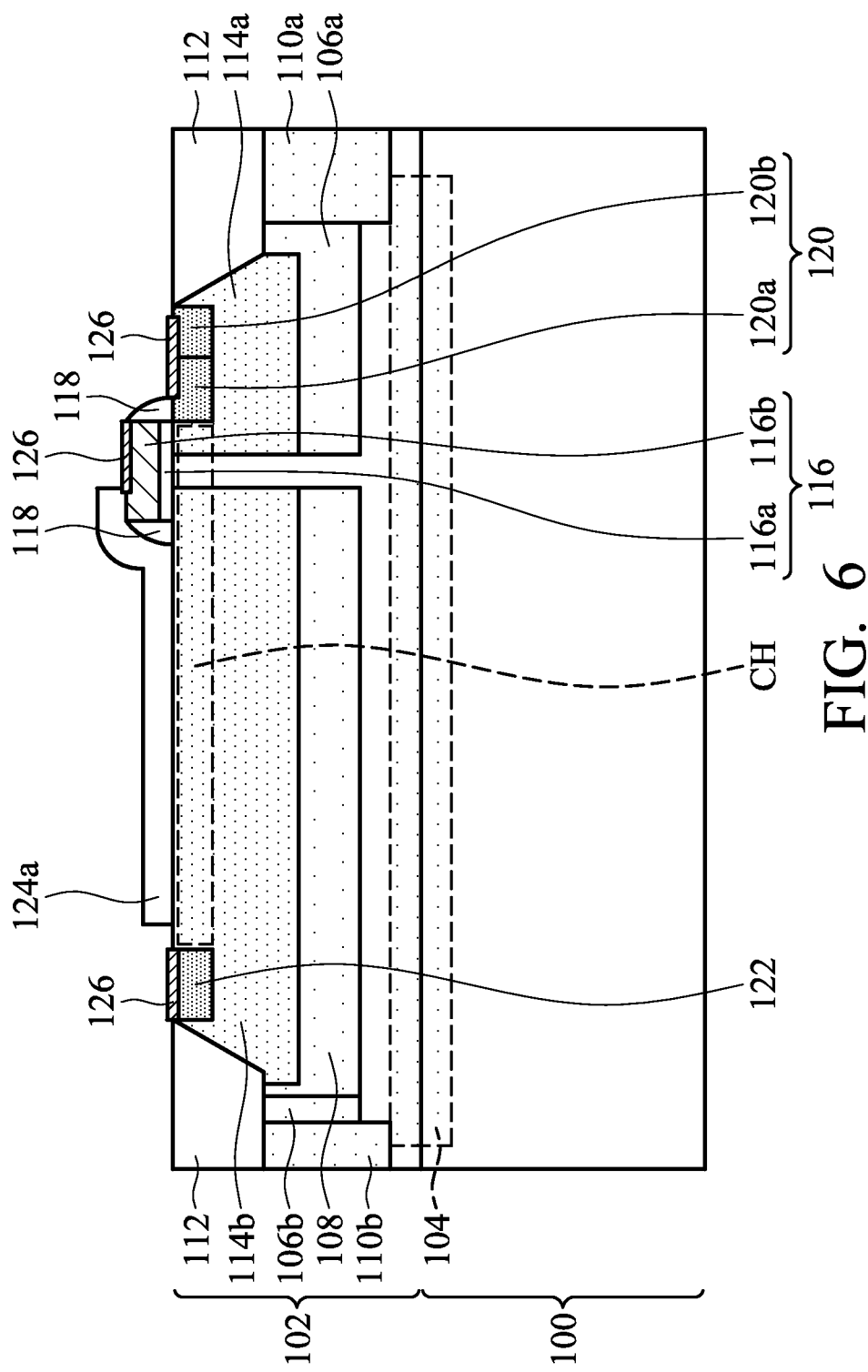
Figure 7:
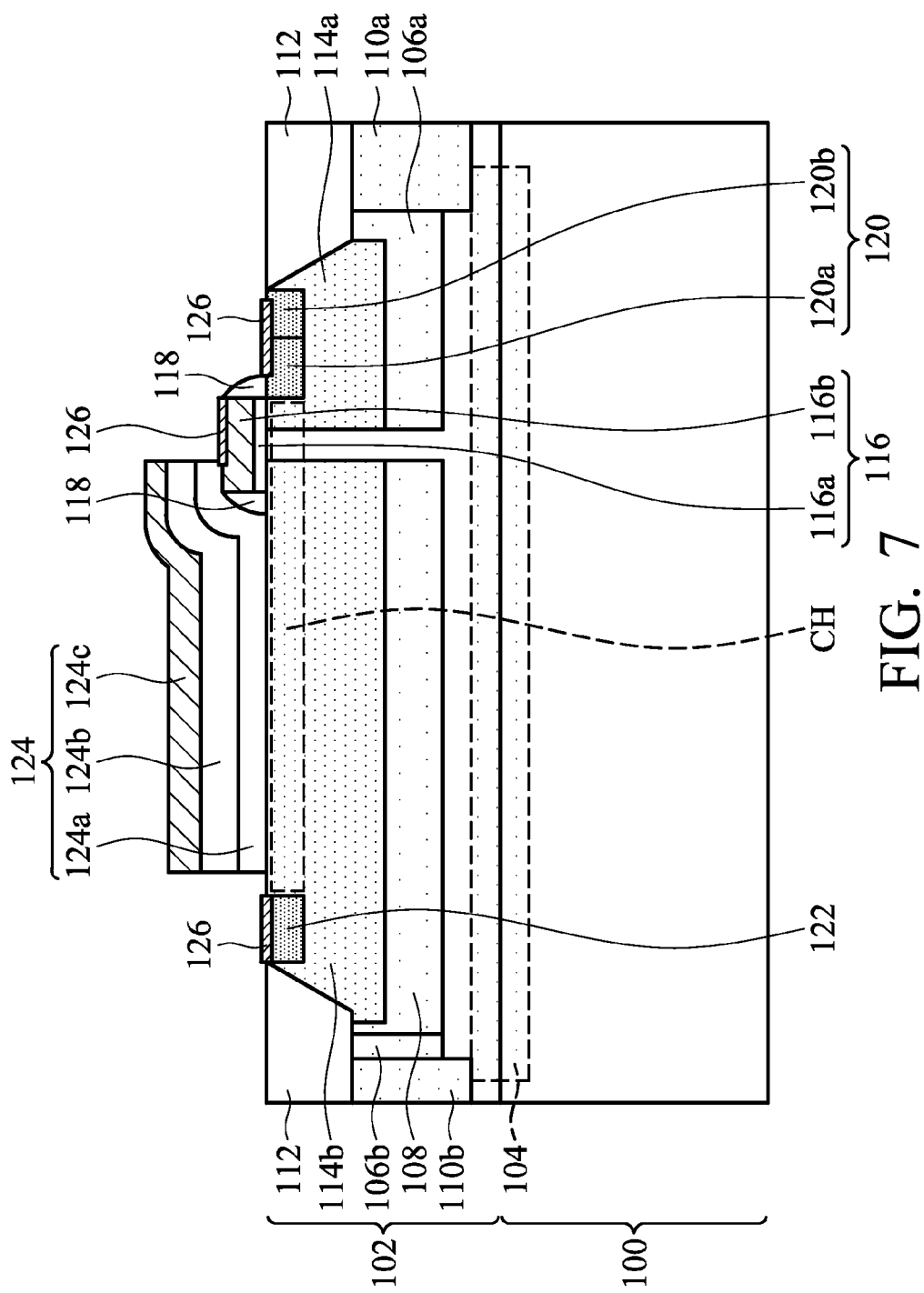

Next, referring to FIGS. 6-7, a stack structure 124 is formed between the gate structure 116 and the drain region 122. The stack structure 124 includes a sequentially stacked blocking layer 124a, an insulating layer 124b and a conductive layer 124c. The conductive layer 124c is electrically connected to the source region 120 or the gate structure 116 through a subsequent interconnection structure such that the stack structure 124 may decrease the electric field density of the channel CH in the epitaxial layer 102 under the stack structure 124, which in turn decreases the on-resistance ($R_{on}$) of the high-voltage semiconductor device.

In the stack structure 124, the insulating layer 124b is disposed over the blocking layer 124a, and the conductive layer 124c is disposed over the insulating layer 124b. In one embodiment, referring to FIG. 6, the blocking layer 124a is formed over the epitaxial layer 102 between the gate structure 116 and the drain region 122 first. The blocking layer 124a conformally covers a portion of the gate structure 116, and completely covers the insulating bump 132a. The blocking layer 124a is used to cover the portion of the gate structure 116 where the formation of metal silicide is undesired. Therefore, the portion of the gate structure 116 covered by the blocking layer 124a will not contact metal to form metal silicide in the subsequent metal silicidation step. The material of the blocking layer 124a may include, but is not limited to, silicon oxide, silicon nitride, silicon oxynitride formed by chemical vapor deposition (CVD), any other suitable insulating materials, or a combination thereof.

Then, a metal silicidation step may optionally be performed to form a metal silicide layer 126 at the exposed surface of the source region 120, the drain region 122 and the gate structure 116. The metal silicide layer 126 may further decrease the on-resistance of the device. The material of the metal silicide layer 126 may include, but is not limited to, nickel silicide, cobalt silicide, tungsten silicide, titanium silicide, tantalum silicide, platinum silicide or erbium silicide.

Next, Referring to FIG. 7, the insulating layer 124b is formed over the blocking layer 124a. The insulating layer 124b is used to electrically insulate the conductive layer 124c from the blocking layer 124a and the epitaxial layer 102 thereunder. The material of the insulating layer 124b may include, but is not limited to, oxide, nitride, oxynitride, low-k material, any other suitable insulating material, or a combination thereof. In addition, the insulating layer 124b may be formed by the previously described chemical vapor deposition.

Subsequently, the conductive layer 124c is formed over the insulating layer 124b to complete the stack structure 124. The material of the conductive layer 124c may include, but is not limited to, metal, metal oxide, metal nitride, metal alloy, metal silicide, any other suitable conductive material, or a combination thereof. In addition, the stack structure 124 conformally covers a portion of the gate structure 116. According to the previous description, the conductive layer 124c enables the stack structure 124 to decrease the electric field density of the channel CH in the epitaxial layer 102 under the stack structure 124, which in turn decreases the on-resistance of the high-voltage semiconductor device.

Figure 8:
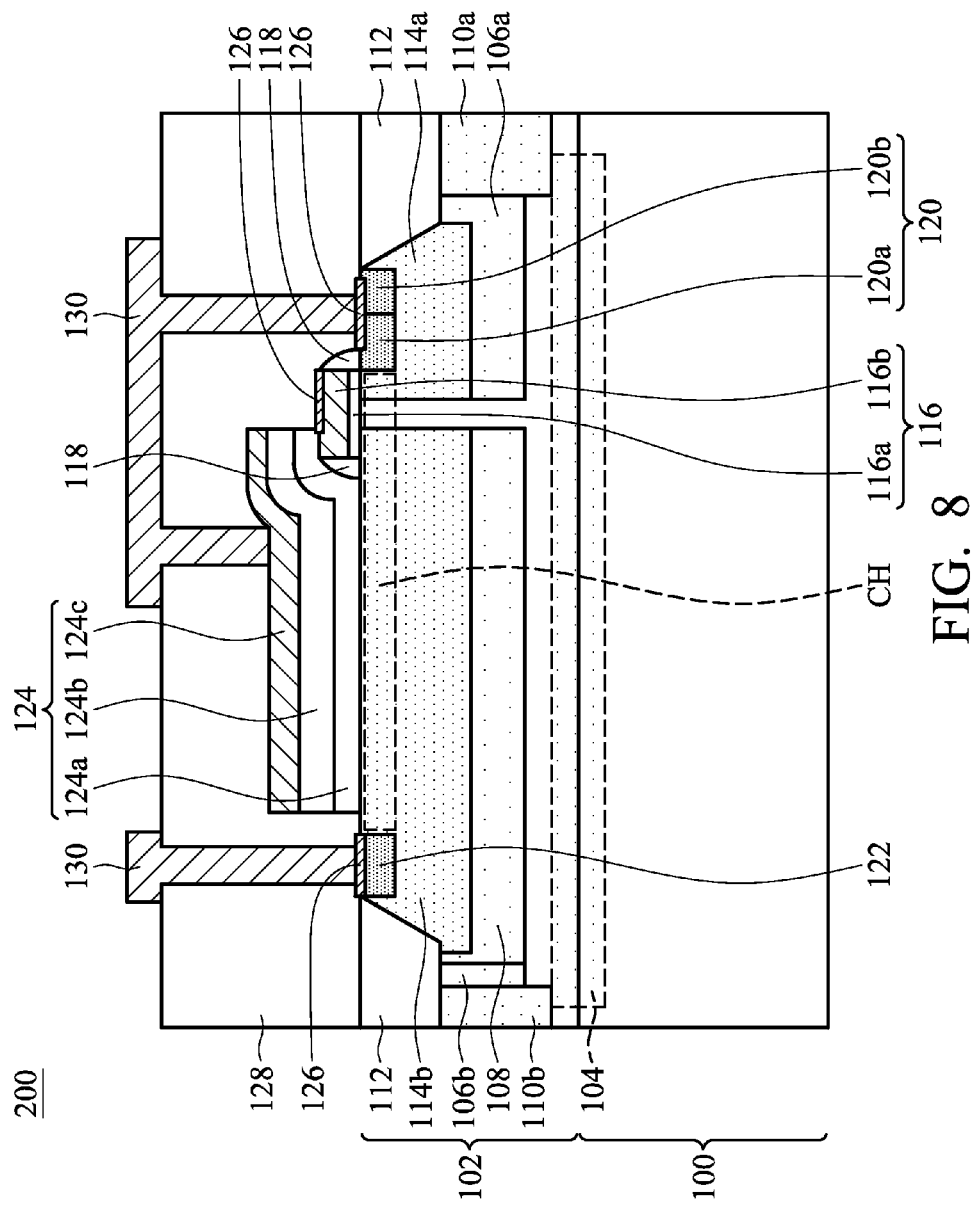

Referring to FIG. 8, an interlayer dielectric (ILD) layer 128 is formed. The interlayer dielectric layer 128 may include, but is not limited to, silicon oxide, silicon nitride, silicon oxynitride, borophosphosilicate glass (BPSG), phosphosilicate glass (PSG), spin-on-glass (SOG), dielectric material formed by high-density plasma (HDP) deposition, any other suitable dielectric material, or a combination thereof. The interlayer dielectric layer 128 may be formed by the previously described chemical vapor deposition or spin-on coating and patterning process.

Next, an interconnection structure 130 is formed in the interlayer dielectric layer 128 to form the high-voltage semiconductor device 200. The material of the interconnection structure 130 may include, but is not limited to, Cu, Al, W, doped poly-Si, any other suitable conductive materials, or a combination thereof. In the embodiment shown in FIG. 8, the conductive layer 124c is electrically connected to the source region 120 through the interconnection structure 130, and the conductive layer 124c is electrically isolated from the gate structure 116. However, in other embodiments, the conductive layer 124c electrically connects the gate structure 116 through the interconnection structure 130, and the conductive layer 124c is electrically isolated from the source region 120. This will be described in detail in the following description.

Referring to FIG. 8, the high-voltage semiconductor device 200 of the present disclosure includes the substrate 100 and the epitaxial layer 102 disposed over the substrate 100 and having a first conductive type. The gate structure 116 is disposed over the epitaxial layer 102. The first conductive type first high-voltage well region 106a and the second conductive type high-voltage well region 108 are disposed in the epitaxial layer 102 at opposite sides of the gate structure 116 respectively. The first conductive type is different from the second conductive type. In addition, The source region 120 and the drain region 122 are disposed in the epitaxial layer 102 at opposite sides of the gate structure 116 respectively. The stack structure 124 is disposed between the gate structure 116 and the drain region 122, and the stack structure 124 includes the lowermost blocking layer 124a, the insulating layer 124b disposed over the blocking layer 124a and the conductive layer 124c disposed over the insulating layer 124b. The conductive layer 124c electrically connects the source region 120 or the gate structure 116.

In addition, the high-voltage semiconductor device 200 of the present disclosure may further include the first conductive type second high-voltage well region 106b disposed in the epitaxial layer 102. The first conductive type second high-voltage well region 106b directly contacts the second conductive type high-voltage well region 108. The high-voltage semiconductor device 200 of the present disclosure may further include the second conductive type first deep well region 110a disposed in the epitaxial layer 102. The second conductive type first deep well region 110a directly contacts the first conductive type first high-voltage well region 106a. The high-voltage semiconductor device 200 of the present disclosure may further include the second conductive type second deep well region 110b disposed in the epitaxial layer 102. The second conductive type second deep well region 110b directly contacts the first conductive type second high-voltage well region 106b. The high-voltage semiconductor device 200 of the present disclosure may further include the second conductive type doping region 114b disposed in the second conductive type high-voltage well region 108 and the first conductive type doping region 114a disposed in the first conductive type first high-voltage well region 106a. The source region 120 is disposed in the first conductive type doping region 114a, and the drain region 122 is disposed in the second conductive type doping region 114b.

Figure 9:
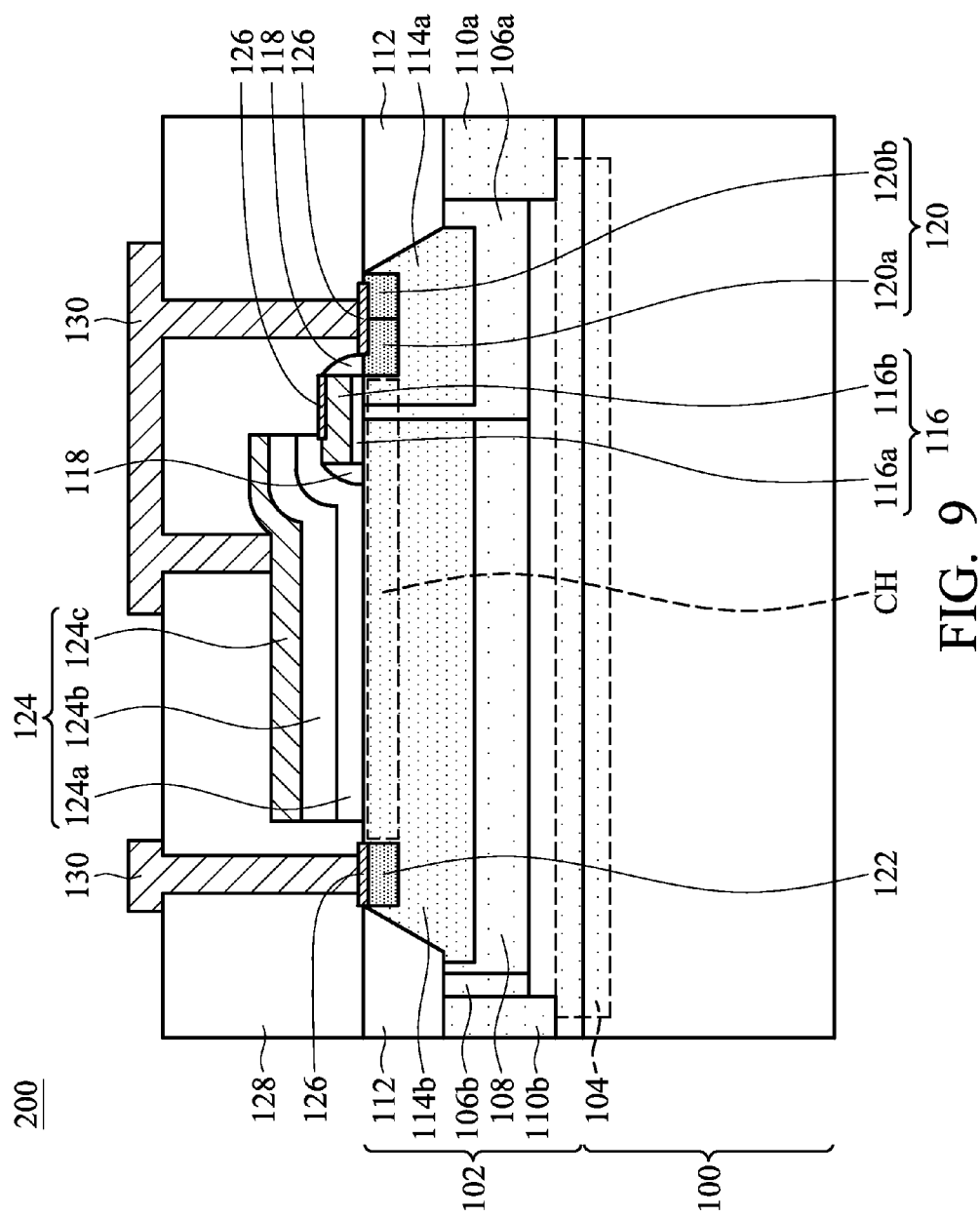
FIG. 9 is a cross-sectional view of a high-voltage semiconductor device in accordance with another embodiment of the present disclosure.

In addition, although the first conductive type first high-voltage well region does not directly contact the second conductive type high-voltage well region in the embodiments shown in FIGS. 1-8, those skilled in the art will appreciate that the first conductive type first high-voltage well region may also directly contact the second conductive type high-voltage well region, as shown in FIG. 9.

Referring to FIG. 9, which is a cross-sectional view of a high-voltage semiconductor device in accordance with another embodiment of the present disclosure. The difference between the embodiment shown in FIG. 9 and the embodiment shown in FIGS. 1-8 is that the first conductive type first high-voltage well region 106a directly contacts the second conductive type high-voltage well region 108. Due to the direct contact of the first conductive type first high-voltage well region 106a and the second conductive type high-voltage well region 108, the gate-to-drain capacitance of the high-voltage semiconductor device may be decreased further, and thus the high-voltage semiconductor device may be improved.

Figure 10:
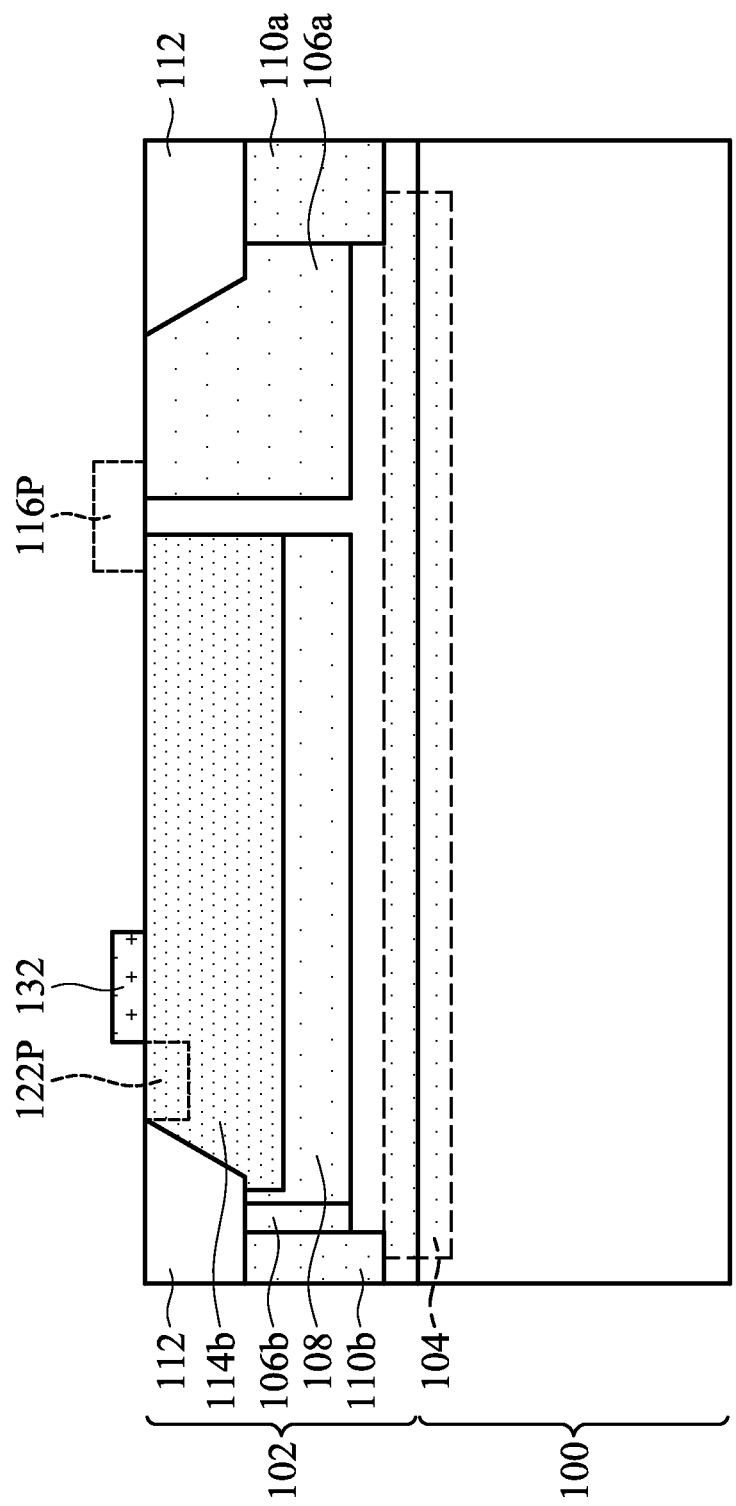
FIGS. 10-11 are cross-sectional views of a high-voltage semiconductor device at various manufacturing stages in accordance with another embodiment of the present disclosure.
Figure 11:
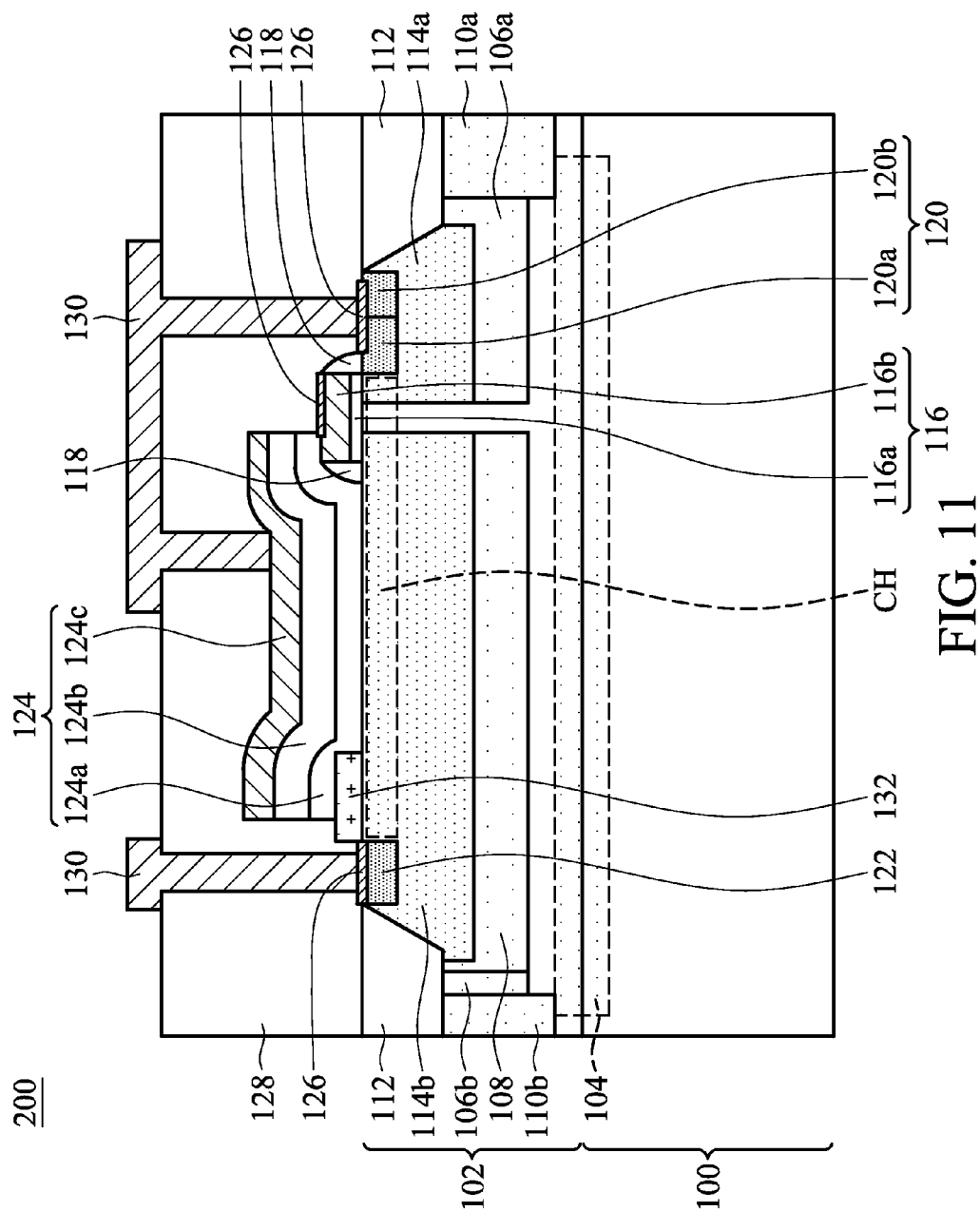

In addition, the high-voltage semiconductor device 200 of the present disclosure may further include an insulating bump 132 disposed between the gate structure 116 and the drain region 122, as shown in FIGS. 10-11. FIGS. 10-11 are cross-sectional views of a high-voltage semiconductor device at various manufacturing stages in accordance with another embodiment of the present disclosure.

Referring to FIG. 10, after the trench isolation structure 112 is formed (or after the second conductive type doping region 114b is formed) and before the gate structure 116 is formed, the insulating bump 132 may optionally be formed over the epitaxial layer 102. The insulating bump 132 is disposed between the predetermined gate structure region 116P (namely the subsequent gate structure 116) and the predetermined drain region 122P (namely the subsequent drain region 112) to further decrease the electric field density in the channel CH in the epitaxial layer 102 under the insulating bump 132, which in turn decreases the on-resistance ($R_{on}$) of the device.

The insulating bumps 132 may include, but are not limited to, silicon oxide, silicon nitride, silicon oxynitride formed by chemical vapor deposition (CVD), any other suitable insulating materials, or a combination thereof. The chemical vapor deposition may include, but is not limited to, low pressure chemical vapor deposition (LPCVD), low temperature chemical vapor deposition (LTCVD), rapid thermal chemical vapor deposition (RTCVD), plasma enhanced chemical vapor deposition (PECVD), atomic layer deposition (ALD), or any other suitable method.

Next, the high-voltage semiconductor device 200 shown in FIG. 11 may be formed according to the aforementioned manufacturing steps. In this high-voltage semiconductor device 200, the stack structure 124 (or blocking layer 124a) conformally covers a portion of the insulating bump 132. However, those skilled in the art will appreciate that the stack structure 124 (or blocking layer 124a) may also completely cover the insulating bump 132.

Since the distance from the conductive layer 124c of the stack structure 124 to the channel CH in the epitaxial layer 102 may be varied and increased due to the insulating bumps 132, the effect of the conductive layer 124c on the electric field in the channel CH may varied. Therefore, the insulating bump 132 may further decrease the electric field density of the channel CH in the epitaxial layer 102 under the insulating bump 132, which in turn decreases the on-resistance of the device.

Figure 12:
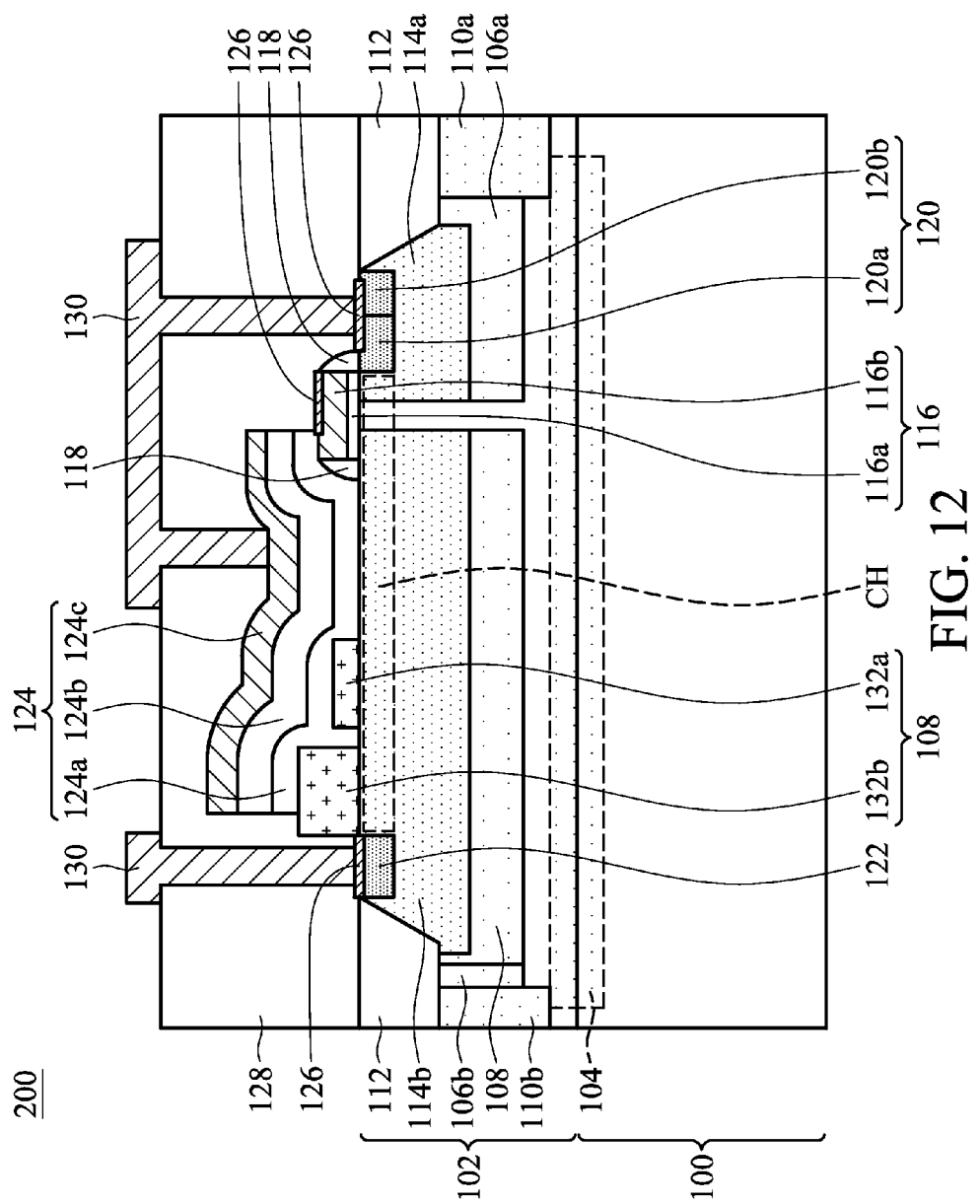
FIG. 12 is a cross-sectional view of a high-voltage semiconductor device in accordance with another embodiment of the present disclosure.

It should be noted that, although the high-voltage semiconductor device 200 includes only one insulating bump in the embodiments shown in FIGS. 10-11, those skilled in the art will appreciate that the high-voltage semiconductor device may include more than one insulating bump as shown in FIG. 12. Therefore, the exemplary embodiments set forth in FIGS. 10-11 is merely for the purpose of illustration, the inventive concept may be embodied in various forms without being limited to the exemplary embodiments as shown in FIGS. 10-11.

Referring to FIG. 12, which is a cross-sectional view of a high-voltage semiconductor device in accordance with another embodiment of the present disclosure. The difference between the embodiment shown in FIG. 12 and the embodiment shown in FIGS. 10-11 is that the high-voltage semiconductor device 200 includes a plurality of insulating bumps 132a and 132b disposed between the gate structure 116 and the drain region 122. In addition, the insulating bump which is closer to the drain region 122 has a greater height.

In particular, in FIG. 12, the insulating bump 132 which is closer to the drain region 122 at the left side has a greater height. For example, the insulating bump 132b, which is closer to the drain region 122, has a greater height than the insulating bump 132a, which is farther from the drain region 122. As the insulating bump 132 closer to the drain region 122 has a greater height, the effect of the conductive layer 124c on the electric field in the channel CH may vary continuously; therefore, the electric field density of the channel CH in the epitaxial layer 102 and the on-resistance of the device may be decreased further.

It should be noted that, although FIG. 12 merely illustrates two insulating bumps, the high-voltage semiconductor device of the present disclosure may also include more than two insulating bumps. The exemplary embodiment set forth in FIG. 12 is merely for the purpose of illustration, the inventive concept may be embodied in various forms without being limited to the exemplary embodiments shown in FIG. 12.

In addition, it should be noted that although the stack structure 124 in FIG. 12 partially covers the insulating bump 132b and completely covers the insulating bump 132a, those skilled in the art will appreciate that, when the high-voltage semiconductor device of the present disclosure includes more insulating bumps 132, the stack structure 124 partially covers the insulating bump 132 which is most directly adjacent to the drain region 122 and completely covers structures other the insulating bumps 132. It should be noted that the exemplary embodiment set forth in FIG. 12 is merely for the purpose of illustration, and the inventive concept may be embodied in various forms without being limited to the exemplary embodiments.

Figure 13:
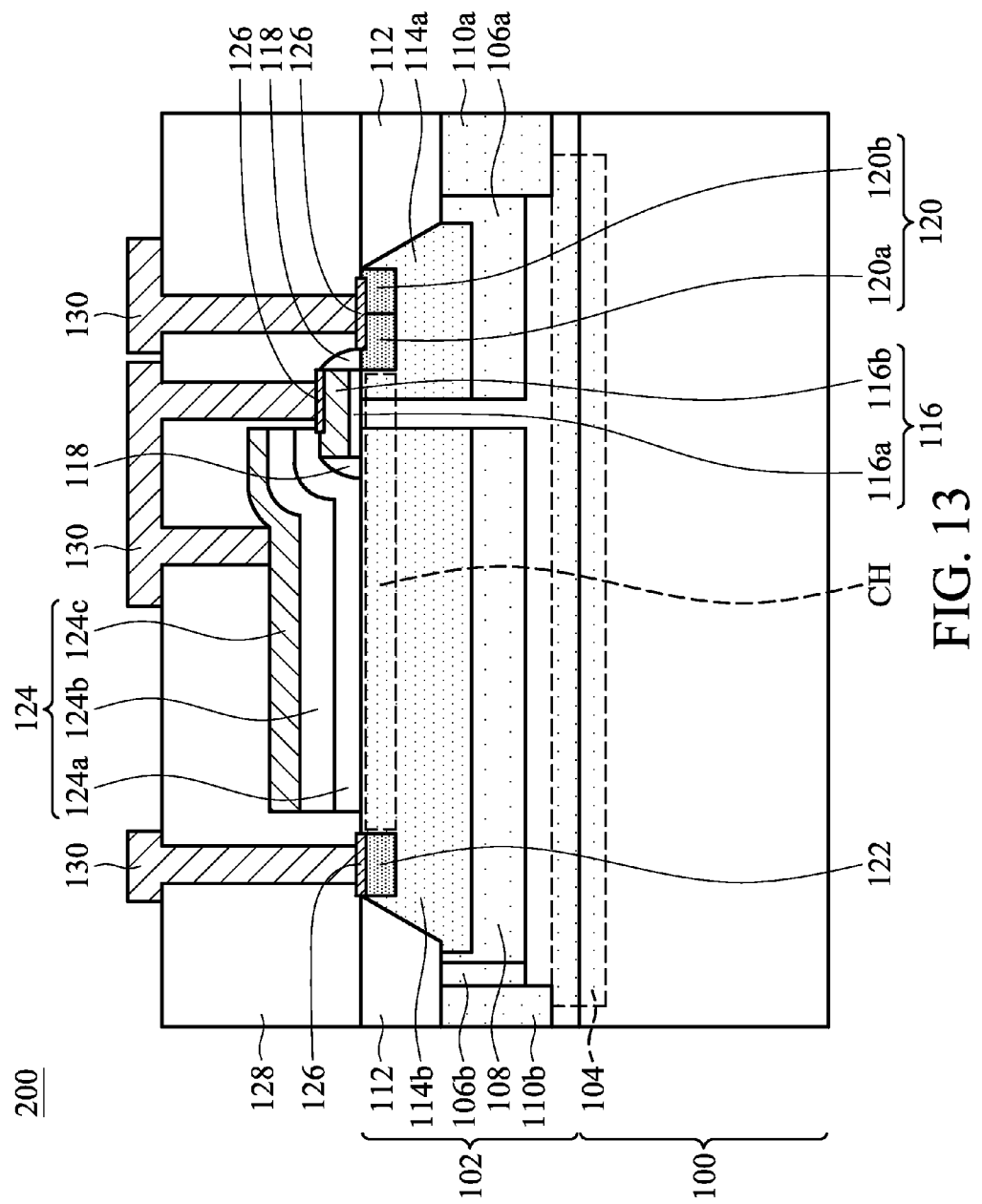
FIG. 13 is a cross-sectional view of a high-voltage semiconductor device in accordance with another embodiment of the present disclosure.

In addition, although the above embodiments merely illustrate that the conductive layer electrically connects the source region and is electrically isolated from the gate structure, those skilled in the art will appreciate that the conductive layer may also electrically connect the gate structure and be electrically isolated from the source region, as shown in the embodiment of FIG. 13.

Referring to FIG. 13, which is a cross-sectional view of a high-voltage semiconductor device 200 in accordance with another embodiment of the present disclosure. As shown in FIG. 13, the conductive layer 124c electrically connects the gate structure 116 through the interconnection structure 130, and the conductive layer 124c is electrically isolated from the source region 120.

It should be noted that although the above description merely illustrates embodiments with the first conductive type being P-type and the second conductive type being N-type, those skilled in the art will appreciate that the first conductive type may be N-type with the second conductive type being P-type.

In summary, the present disclosure utilizes the stack structure including the conductive layer to decrease the electric field density of the channel in the epitaxial layer, which in turn decreases the on-resistance ($R_{on}$) of the high-voltage semiconductor device. In addition, the insulating bump disposed between the gate structure and the drain region may further decrease the on-resistance.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A high-voltage semiconductor device, comprising:
a substrate;
an epitaxial layer disposed over the substrate and having a first conductive type;
a gate structure disposed over the epitaxial layer;
a first conductive type first high-voltage well region and a second conductive type high-voltage well region disposed in the epitaxial layer at opposite sides of the gate structure respectively, wherein the first conductive type is different from the second conductive type;
a source region and a drain region disposed in the epitaxial layer at opposite sides of the gate structure respectively; and
a stack structure disposed between the gate structure and the drain region, wherein the stack structure comprises:
a blocking layer;
an insulating layer disposed over the blocking layer; and a conductive layer disposed over the insulating layer and electrically connected to the source region or the gate structure.

2. The high-voltage semiconductor device as claimed in claim 1, wherein the first conductive type first high-voltage well region and the second conductive type high-voltage well region partially extend under the gate structure, and the first conductive type first high-voltage well region does not directly contact the second conductive type high-voltage well region.

3. The high-voltage semiconductor device as claimed in claim 1, wherein the first conductive type first high-voltage well region and the second conductive type high-voltage well region partially extend under the gate structure, and the first conductive type first high-voltage well region directly contacts the second conductive type high-voltage well region.

4. The high-voltage semiconductor device as claimed in claim 1, further comprising:
a first conductive type second high-voltage well region disposed in the epitaxial layer, wherein the first conductive type second high-voltage well region directly contacts the second conductive type high-voltage well region.

5. The high-voltage semiconductor device as claimed in claim 4, further comprising:
a second conductive type first deep well region disposed in the epitaxial layer, wherein the second conductive type first deep well region directly contacts the first conductive type first high-voltage well region; and
a second conductive type second deep well region disposed in the epitaxial layer, wherein the second conductive type second deep well region directly contacts the first conductive type second high-voltage well region.

6. The high-voltage semiconductor device as claimed in claim 5, further comprising:
a doping barrier region disposed in the epitaxial layer, wherein the doping barrier region directly contacts the second conductive type first deep well region and the second conductive type second deep well region.

7. The high-voltage semiconductor device as claimed in claim 1, further comprising:
a second conductive type doping region disposed in the second conductive type high-voltage well region; and
a first conductive type doping region disposed in the first conductive type first high-voltage well region, wherein the source region is disposed in the first conductive type doping region, and the drain region is disposed in the second conductive type doping region.

8. The high-voltage semiconductor device as claimed in claim 1, further comprising an insulating bump disposed between the gate structure and the drain region, wherein the stack structure conformally covers a portion of the insulating bump.

9. The high-voltage semiconductor device as claimed in claim 1, further comprising a plurality of insulating bumps disposed between the gate structure and the drain region, wherein the insulating bump which is closer to the drain region has a greater height.

10. The high-voltage semiconductor device as claimed in claim 1, wherein a material of the blocking layer comprises oxide, nitride, oxynitride or a combination thereof.

11. A method for manufacturing a high-voltage semiconductor device, comprising:
providing a substrate;
forming an epitaxial layer over the substrate, wherein the epitaxial layer has a first conductive type;
forming a first conductive type first high-voltage well region and a second conductive type high-voltage well region in the epitaxial layer, wherein the first conductive type is different from the second conductive type;
forming a gate structure over the epitaxial layer, wherein the first conductive type first high-voltage well region and the second conductive type high-voltage well region are disposed at opposite sides of the gate structure respectively;
forming a source region and a drain region, wherein the source region and the drain region are disposed in the epitaxial layer at opposite sides of the gate structure respectively; and
forming a stack structure between the gate structure and the drain region, wherein the stack structure comprises:
a blocking layer;
an insulating layer disposed over the blocking layer; and
a conductive layer disposed over the insulating layer and electrically connected to the source region or the gate structure.

12. The method for manufacturing the high-voltage semiconductor device as claimed in claim 11, wherein the first conductive type first high-voltage well region and the second conductive type high-voltage well region partially extend under the gate structure, and the first conductive type first high-voltage well region does not directly contact the second conductive type high-voltage well region.

13. The method for manufacturing the high-voltage semiconductor device as claimed in claim 11, wherein the first conductive type first high-voltage well region and the second conductive type high-voltage well region partially extend under the gate structure, and the first conductive type first high-voltage well region directly contacts the second conductive type high-voltage well region.

14. The method for manufacturing the high-voltage semiconductor device as claimed in claim 11, further comprising:
before forming the gate structure, forming a first conductive type second high-voltage well region in the epitaxial layer, wherein the first conductive type second high-voltage well region directly contacts the second conductive type high-voltage well region.

15. The method for manufacturing the high-voltage semiconductor device as claimed in claim 14, further comprising:
before forming the gate structure, forming a second conductive type first deep well region in the epitaxial layer, wherein the second conductive type first deep well region directly contacts the first conductive type first high-voltage well region; and
before forming the gate structure, forming a second conductive type second deep well region in the epitaxial layer, wherein the second conductive type second deep well region directly contacts the first conductive type second high-voltage well region.

16. The method for manufacturing the high-voltage semiconductor device as claimed in claim 15, further comprising:
before forming the gate structure, forming a doping barrier region in the epitaxial layer, wherein the doping barrier region directly contacts the second conductive type first deep well region and the second conductive type second deep well region.

17. The method for manufacturing the high-voltage semiconductor device as claimed in claim 11, further comprising:
before forming the gate structure, forming a second conductive type doping region in the second conductive type high-voltage well region; and
before forming the source region, forming a first conductive type doping region in the first conductive type first high-voltage well region, wherein the source region is disposed in the first conductive type doping region, and the drain region is disposed in the second conductive type doping region.

18. The method for manufacturing the high-voltage semiconductor device as claimed in claim 11, further comprising:
before forming the gate structure, forming an insulating bump between the gate structure and the drain region, wherein the stack structure formed after the gate structure conformally covers a portion of the insulating bump.

19. The method for manufacturing the high-voltage semiconductor device as claimed in claim 11, further comprising:
before forming the gate structure, forming a plurality of insulating bumps between the gate structure and the drain region, wherein the insulating bump which is closer to the drain region has a greater height.

20. The method for manufacturing the high-voltage semiconductor device as claimed in claim 11, wherein a material of the blocking layer comprises oxide, nitride, oxynitride or a combination thereof.

* * * * *